US012568577B2

(12) United States Patent
Lin et al.

(10) Patent No.: US 12,568,577 B2
(45) Date of Patent: Mar. 3, 2026

(54) FLEXIBLE COPPER-CLAD LAMINATE AND PRINTED CIRCUIT MADE THEREFROM

(71) Applicant: DUPONT ELECTRONICS, INC., Wilmington, DE (US)

(72) Inventors: Shih-Ching Lin, Hsinchu (TW); Tung Lin Li, New Taipei City (TW)

(73) Assignee: DUPONT ELECTRONICS, INC

( * ) Notice: Subject to any disclaimer, the term of this patent is extended or adjusted under 35 U.S.C. 154(b) by 195 days.

(21) Appl. No.: 18/302,258

(22) Filed: Apr. 18, 2023

(65) Prior Publication Data

US 2023/0354517 A1     Nov. 2, 2023

Related U.S. Application Data

(60) Provisional application No. 63/335,334, filed on Apr. 27, 2022.

(51) Int. Cl.
H05K 1/09 (2006.01)
B32B 15/02 (2006.01)
(Continued)

(52) U.S. Cl.
CPC .............. H05K 1/09 (2013.01); B32B 15/02 (2013.01); B32B 15/04 (2013.01); B32B 15/043 (2013.01);
(Continued)

(58) Field of Classification Search
CPC ... H05K 2201/0154; H05K 2201/0355; H05K 3/022; H05K 3/382; H05K 1/09; H05K 1/02; H05K 1/0237; H05K 1/0277; H05K 1/03; H05K 1/0326; H05K 1/11; H05K 1/0393; B32B 2311/12; B32B 15/08;

B32B 15/20; B32B 15/02; B32B 15/04; B32B 15/043; B32B 2379/08; B32B 2457/08; C23C 28/00; C23C 28/02; C23C 28/023; C23C 28/025; C23C 28/04; C23C 28/042; C23C 28/30; C23C 28/32; C23C 28/321; C23C 28/322; C23C 28/3225; C23C 28/34; C23C 28/345; C23C 28/3455; C23C 30/00; C23C 30/005; Y10T 428/12431;
(Continued)

(56) References Cited

U.S. PATENT DOCUMENTS

2017/0032978 A1     2/2017   Moriyama et al.
2017/0188451 A1*    6/2017   Hu ........................ H05K 1/0242
2018/0288884 A1    10/2018   Ori et al.

FOREIGN PATENT DOCUMENTS

JP          2008-159896 A       7/2008
JP          2017025405 A  *     2/2017    ............. B32B 15/04
(Continued)

OTHER PUBLICATIONS

Machine Translation, Arai, JP 2018-172785 A, Nov. 8, 2018. (Year: 2018).*

(Continued)

*Primary Examiner* — Michael E. La Villa

(57)     ABSTRACT

Disclosed are surface-treated copper foils having at least one treated surface that exhibit high conductivity and a set of surface properties. Also provided are flexible copper-clad laminates and printed circuits made therefrom. The present printed circuits exhibit low insertion loss and are suitable for use in high speed/high frequency applications.

6 Claims, 3 Drawing Sheets

100

(51) Int. Cl.

| | |
|---|---|
| *B32B 15/04* | (2006.01) |
| *B32B 15/08* | (2006.01) |
| *B32B 15/20* | (2006.01) |
| *C23C 28/00* | (2006.01) |
| *C23C 28/02* | (2006.01) |
| *C23C 28/04* | (2006.01) |
| *C23C 30/00* | (2006.01) |
| *H05K 1/00* | (2006.01) |
| *H05K 1/02* | (2006.01) |
| *H05K 1/03* | (2006.01) |
| *H05K 1/11* | (2006.01) |
| *H05K 3/02* | (2006.01) |
| *H05K 3/38* | (2006.01) |

(52) U.S. Cl.

CPC .............. *B32B 15/08* (2013.01); *B32B 15/20* (2013.01); *C23C 28/00* (2013.01); *C23C 28/02* (2013.01); *C23C 28/023* (2013.01); *C23C 28/025* (2013.01); *C23C 28/04* (2013.01); *C23C 28/042* (2013.01); *C23C 28/30* (2013.01); *C23C 28/32* (2013.01); *C23C 28/321* (2013.01); *C23C 28/322* (2013.01); *C23C 28/3225* (2013.01); *C23C 28/34* (2013.01); *C23C 28/345* (2013.01); *C23C 28/3455* (2013.01); *C23C 30/00* (2013.01); *C23C 30/005* (2013.01); *H05K 1/00* (2013.01); *H05K 1/02* (2013.01); *H05K 1/0237* (2013.01); *H05K 1/0277* (2013.01); *H05K 1/03* (2013.01); *H05K 1/0326* (2013.01); *H05K 1/11* (2013.01); *H05K 3/022* (2013.01); *H05K 3/382* (2013.01); *B32B 2311/12* (2013.01); *B32B 2379/08* (2013.01); *B32B 2457/08* (2013.01); *H05K 1/0393* (2013.01); *H05K 2201/0154* (2013.01); *H05K 2201/0355* (2013.01); *Y10T 428/12431* (2015.01); *Y10T 428/12438* (2015.01); *Y10T 428/12493* (2015.01); *Y10T 428/12556* (2015.01); *Y10T 428/12569* (2015.01); *Y10T 428/12576* (2015.01); *Y10T 428/12583* (2015.01); *Y10T 428/1259* (2015.01); *Y10T 428/12597* (2015.01); *Y10T 428/12604* (2015.01); *Y10T 428/12611* (2015.01); *Y10T 428/12618* (2015.01); *Y10T 428/12882* (2015.01); *Y10T 428/12903* (2015.01); *Y10T 428/1291* (2015.01); *Y10T 428/12993* (2015.01); *Y10T 428/2495* (2015.01); *Y10T 428/24959* (2015.01); *Y10T 428/24967* (2015.01); *Y10T 428/24975* (2015.01); *Y10T 428/26* (2015.01); *Y10T 428/263* (2015.01); *Y10T 428/264* (2015.01); *Y10T 428/265* (2015.01); *Y10T 428/27* (2015.01); *Y10T 428/273* (2015.01)

(58) Field of Classification Search

CPC ..... Y10T 428/12438; Y10T 428/12493; Y10T 428/12556; Y10T 428/12569; Y10T 428/12576; Y10T 428/12583; Y10T 428/12597; Y10T 428/12604; Y10T 428/1259; Y10T 428/12611; Y10T 428/12618; Y10T 428/12903; Y10T 428/1291; Y10T 428/12882; Y10T 428/12993; Y10T 428/2495; Y10T 428/24959; Y10T 428/24967; Y10T 428/24975; Y10T 428/26; Y10T 428/263; Y10T 428/264; Y10T 428/265; Y10T 428/27; Y10T 428/273

See application file for complete search history.

(56) References Cited

FOREIGN PATENT DOCUMENTS

| | | | | |
|---|---|---|---|---|
| JP | 2018172785 A | * | 11/2018 | ............ B32B 15/08 |
| TW | I339222 B | | 3/2011 | |
| WO | 2021/220524 A1 | | 11/2021 | |

OTHER PUBLICATIONS

Machine Translation, Moriyama, JP 2017-025405 A, Feb. 2, 2017. (Year: 2017).*

"Ultra Thin Copper Foil with Carrier Foil (Heat-Resistant Peelable Copper Foil) "F-HP"," Furukawa Review, No. 38 (2010, no month), downloaded from www.furukawa.co.jp on Mar. 4, 2025 (two pages). (Year: 2010).*

English Translation of Notice of Preliminary Rejection dated Nov. 12, 2025 for relevant Korean Patent application No. 10-2023-0055381.

* cited by examiner

100

200

FLEXIBLE COPPER-CLAD LAMINATE AND PRINTED CIRCUIT MADE THEREFROM

FIELD OF THE INVENTION

This invention relates to a surface-treated copper foil, a flexible copper-clad laminate, and a printed circuit made therefrom that exhibits low insertion loss.

BACKGROUND OF THE INVENTION

For an electronic device having a limited space within its core compartment, flexible printed circuit (hereunder referred as "FPC") has the advantages in flexibility, light weight, and compactness over a rigid printed circuit board (PCB). FPCs are particularly preferred to use in the portable electronic devices, for example, mobile phones, laptops, flexible displays, endoscopes for medical use, implant parts, and electronic devices installed in automobiles that are subjected to extreme temperatures and intense vibration.

Nowadays, high speed transmission of electric signals is required for electronic parts in order to raise the information processing speed of electronics and handle high frequency wireless communications. As substrate material for FPC, flexible copper-clad laminate (FCCL) has to upgrade in terms of its performance, i.e. characterized by the Dk/Df properties so that comprehensive performance of FPC will be finally improved. Because a FCCL having high Dk/Df properties is expected to slow down the signal transmission rate and cause signal loss by form of heat energy dissipating in the dielectric layer.

Under the high speed/high frequency conditions, the current of signal transmission is mainly conducted across the surface of copper conductor which is a well-known phenomenon named skin effect. A skin depth serves as an indication of a depth at which a current flows, and it is reduced as the frequency increased.

One approach to lower the conductor loss of FCCL is by reducing the surface roughness of the copper foil considering the skin effect mentioned previously. However, the adhesion strength of the copper foil to the dielectric layer is also weakened as judged by lowered peel strength. Consequently, FPCs made from the FCCL may have reliability and performance issues in a high frequency range (i.e. >1 GHz).

T. Matsunaga et al disclosed in TW 1339222 by using considerable non-copper elements such as nickel or silane to increase the peel strength, anti-rust ability, thermal resistance, or chemical resistance of the copper foil. These non-copper elements, however, possess higher magnetic permeability or higher electric resistance and leads to increased insertion loss.

It is accordingly an object of the invention to provide a surface-treated copper foil having desirable conductivity and surface properties. Another object of the invention is to provide a flexible copper-clad laminate made from the surface-treated copper foil to have sufficiently high peel strength for manufacturing flexible printed circuits that can suitably be used for high speed and/or high frequency applications.

The present inventors conducted extensive studies and found that the surface-treated copper foil has at least one treated surface that must satisfy a set of criteria to suppress the conductor loss.

SUMMARY OF THE INVENTION

This invention provides a surface-treated copper foil that has an electric conductivity of $57.0\times10^6$ S/m or more, a cross-sectional average grain size of 1 μm to about 2.5 μm, a thickness of about 3 μm to about 35 μm; and the surface-treated copper foil has at least one treated surface with a surface roughness (Sz) of 3.0 μm or less.

This invention also provides a flexible copper-clad laminate, comprising:
the surface-treated copper foil of the invention, and
a dielectric layer provided on the at least one treated surface of the surface-treated copper foil,
wherein
the dielectric layer has a thickness of about 5 μm to about 100 μm; and
the dielectric layer is composed of at least one layer of a polymeric material having a thermal decomposition temperature (1%) of 260° C. or higher.

This invention further provides a printed circuit, which is manufactured from the flexible copper-clad laminate of the invention.

DETAILS OF THE INVENTION

Figure 1:
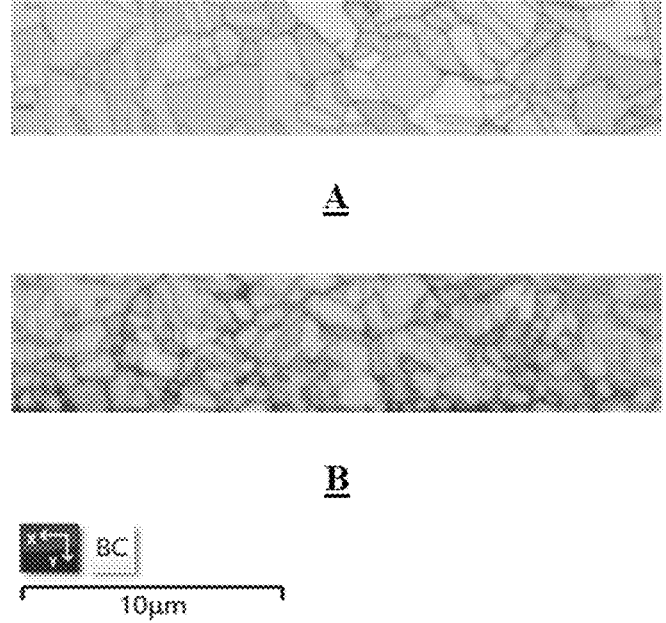
FIG. 1 shows EBSD photographs of two copper foils having different average grain size.

All publications, patent applications, patents and other references mentioned herein, if not otherwise indicated, are explicitly incorporated by reference herein in their entirety for all purposes as if fully set forth.

Unless otherwise defined, all technical and scientific terms used herein have the same meaning as commonly understood by one of ordinary skill in the art to which this invention belongs. In case of conflict, the present specification, including definitions, will control.

Unless stated otherwise, all percentages, parts, ratios, etc., are by weight.

As used herein, the term "produced from" is synonymous to "comprising". As used herein, the terms "comprises," "comprising," "includes," "including," "has," "having," "contains" or "containing," or any other variation thereof, are intended to cover a non-exclusive inclusion. For example, a composition, process, method, article, or apparatus that comprises a list of elements is not necessarily limited to only those elements but may include other elements not expressly listed or inherent to such composition, process, method, article, or apparatus.

The transitional phrase "consisting of" excludes any element, step, or ingredient not specified. If in the claim, such a phrase would close the claim to the inclusion of materials other than those recited except for impurities ordinarily associated therewith. When the phrase "consisting of" appears in a clause of the body of a claim, rather than immediately following the preamble, it limits only the element set forth in that clause; other elements are not excluded from the claim as a whole.

The transitional phrase "consisting essentially of" is used to define a composition, method or apparatus that includes materials, steps, features, components, or elements, in addition to those literally discussed, provided that these additional materials, steps features, components, or elements do not materially affect the basic and novel characteristic(s) of the claimed invention. The term "consisting essentially of" occupies a middle ground between "comprising" and "consisting of".

The term "comprising" is intended to include embodiments encompassed by the terms "consisting essentially of" and "consisting of". Similarly, the term "consisting essentially of" is intended to include embodiments encompassed by the term "consisting of".

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. For example, when a range of "1 to 5" is recited, the recited range should be construed as including ranges "1 to 4", "1 to 3", "1-2", "1-2 & 4-5", "1-3 & 5", and the like. Where a range of numerical values is recited herein, unless otherwise stated, the range is intended to include the endpoints thereof, and all integers and fractions within the range.

When the term "about" is used in describing a value or an end-point of a range, the disclosure should be understood to include the specific value or end-point referred to.

Further, unless expressly stated to the contrary, "or" refers to an inclusive "or" and not to an exclusive "or". For example, a condition A "or" B is satisfied by any one of the following: A is true (or present) and B is false (or not present), A is false (or not present) and B is true (or present), and both A and B are true (or present).

"Mol %" or "mole %" refers to mole percent.

Embodiments of the invention as described in the Summary of the Invention include any other embodiments described herein, can be combined in any manner, and the descriptions of variables in the embodiments pertain not only to the composite laminate of the invention, but also to the articles made therefrom.

The invention is described in detail hereinunder.

Surface-Treated Copper Foil

Copper foils include rolled annealed (RA) copper foils and electrodeposited (ED) copper foils. Because these foils are manufactured in different methods, they differ a lot from each other in terms of mechanical properties, flexibility, and so does in copper roughing treatment. Generally, an ED copper foil has a matte surface (deposit surface) and a shiny surface (drum surface); whereas a RA copper foil has both surfaces being smooth. As the present copper foils are aimed to be incorporated into flexible copper-clad laminates (FC-CLs) and flexible printed circuit boards (FPCBs) for high frequency and/or high speed applications, suitable copper foils are surface-treated copper foils that are derived from raw copper foils that have been subjected to conventional surface treatments at least on one of its surface.

When a copper foil is incorporated into a flexible copper-clad laminate, the side of the copper foil facing toward a dielectric layer is referred as the "lamination side". The opposite side of the "lamination side" is referred as the "resist side". Provided that the present surface-treated copper foil has only one treated surface, then the treated surface becomes the lamination side when it is incorporated into a flexible copper-clad laminate.

By controlling current density, and/or plating time, and/or temperature of plating bath, and/or additives of plating solution, the surface-treated copper foil may have different grain size, surface roughness, and thickness.

The present surface-treated copper foil has high purity with an electric conductivity of $57.0\times10^6$ S/m or higher, or $57.5\times10^6$ S/m or higher.

The cross-sectional crystalline structure of copper foils may be analyzed by an electron backscatter diffraction instrument (EBSD) as shown in FIG. 1. FIG. 1-A shows a copper foil having an average grain size of 1.8 μm (i.e., CF5 in Table 1); FIG. 1-B shows a copper foil having an average grain size of 1.0 μm (i.e., CF4 in Table 1).

In some embodiments of the invention, the present surface-treated copper foil has a cross-sectional average grain size of 1.0 μm or more; or 1.5 μm or more. In some embodiments of the invention, the present surface-treated copper foil preferably has a cross-sectional average grain size of 2.5 μm or less, or 2.0 μm or less.

From the viewpoint of ensuring proper adhesion without increasing the conductor loss, the at least one treated surface of the surface-treated copper foil has a surface roughness (Sz, ten-point mean roughness) of 2.5 μm or less, or 2.0 μm or less, as measured by a laser microscope. The surface roughness (Sz) is measured by using a laser microscope according to ISO 25178.

The lamination side and/or the resist side of the present surface-treated copper may be implemented with a nodulation layer, a passivation layer, and/or an adhesion-promotion layer to enhance the adaptability of copper foil for use in FPCs. Noted that the surface properties of the resist side of the surface-treated copper foil is subjected to many subsequent printed circuit fabrication processes such as micro-etch, acid rinse, brown oxide, black oxide, pre-solder-mask treatment, etc. It's thus understandable that the surface roughness, nodule density, and total amount of the non-copper metal elements are criteria for the lamination side of the present surface-treated copper foil.

Figure 2:
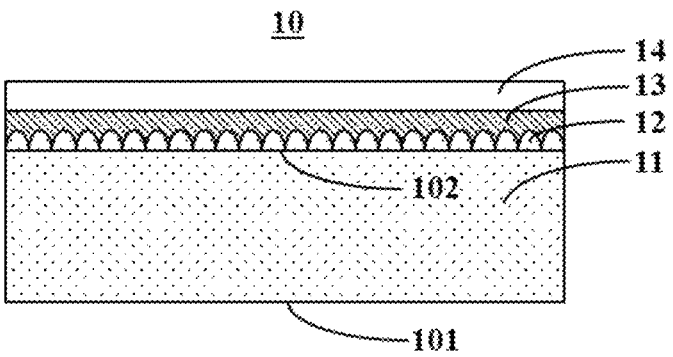
FIG. 2 shows a schematic sideview of the present of surface-treated copper foil 10.

FIG. 2 shows a schematic sideview of a copper foil 10 has an untreated surface 101, a treated surface 102, and a cross sectional copper crystal grain structure 11. The treated surface 102 is composed of a nodulation layer 12, a passivation layer 13, and an adhesion-promotion layer 14.

In some embodiments of the invention, the at least one treated surface of the surface-treated copper foil comprises at least one layer selected from a nodulation layer, a passivation layer, an adhesion-promotion layer, and combinations thereof.

Among the multiple surface treatments, the nodulation layer is generally formed by electrodeposition of copper nodules onto one surface of the raw copper foil first. The nodulation layer may have a nodule density of 300 or less pieces/25 μm², or 200 or less pieces/25 μm², or 100 or less piece/25 μm², or 50 or less piece/25 μm², or 0.1 or less piece/25 μm². Alternatively, 0 piece/25 μm² can be present if there is no nodule electrodeposition.

Figure 3:
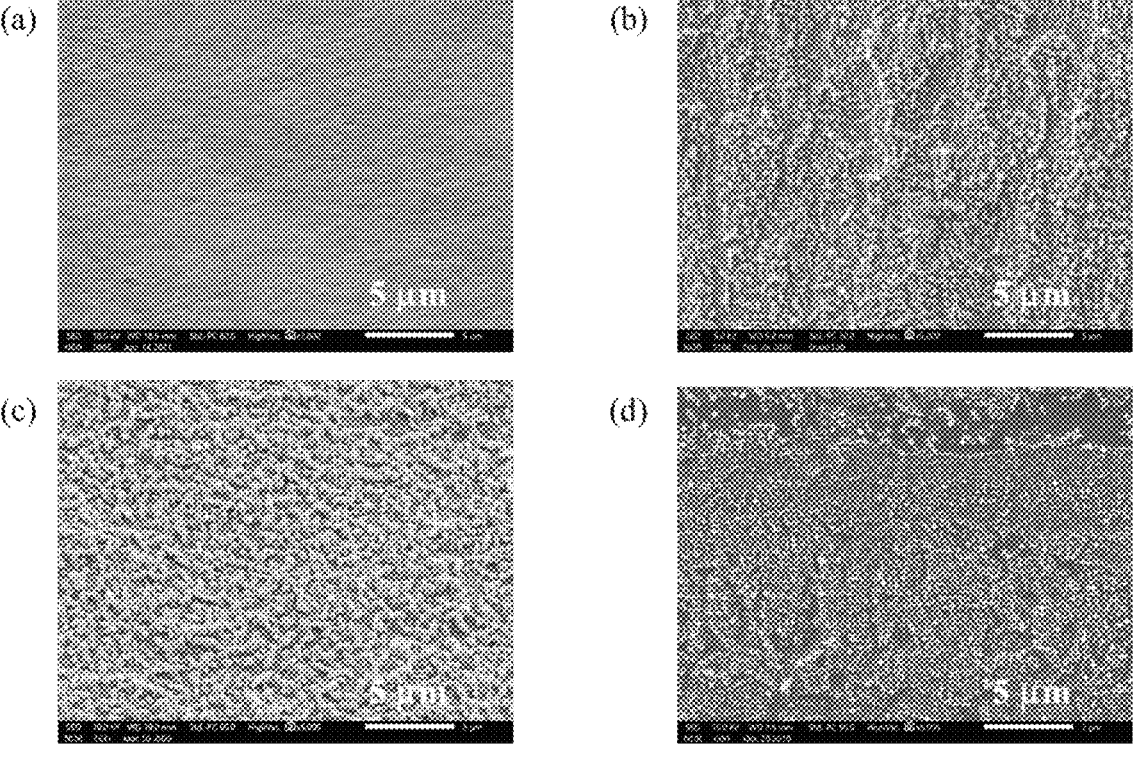
FIG. 3 shows SEM photomicrographs of four copper foils having different nodule density.

The nodule density may be measured and counted by the photomicrograph taken by an SEM instrument. FIG. 3 shows SEM photomicrographs of four copper foils (a)-(d). The nodule density of the treated surface of these copper foils were different from each other (see details in Table 1). FIG. 3-(a) shows a copper foil having a nodule density of 0 piece/25 μm² (CF4). FIG. 3-(b) shows a copper foil having a nodule density of 51 pieces/25 μm² (CF2). FIG. 3-(c) shows a copper foil having a nodule density of 127 pieces/25 μm² (CF7). FIG. 3-(d) shows a copper foil having a nodule density of 314 pieces/25 μm²(CF12).

5                                                              6

In some embodiments of the invention, the at least one treated surface of the surface-treated copper foil comprises a nodulation layer having a nodule density of 300 or less pieces/25 $\mu m^2$; or 200 or less pieces/25 $\mu m^2$; or 100 or less pieces/25 $\mu m^2$; or 50 or less pieces/25 $\mu m^2$.

After the nodule electrodeposition treatment, one or more passivation treatments can be applied on one or both surfaces of the copper foil to provide additional desired properties such as anti-tarnishing, thermal resistance, and chemical resistance, etc. The passivation layers generally include non-copper metal elements such as zinc, nickel, chromium, cobalt, molybdenum, tungsten, and combinations thereof.

The inventors of the present invention discovered that among the non-copper metal elements, the total amount of nickel, cobalt, and molybdenum of the surface-treated copper foil has an optimal range that may impart the desired properties while maintain the low conductor loss property. Noted that majority of the non-copper metal elements exists in the passivation layer, yet they may be introduced at the nodule deposition step occasionally.

In some embodiments of the invention, the at least one treated surface of the surface-treated copper foil comprises at least one passivation layer containing at least one non-copper metal element selected from the group consisting of zinc, nickel, chromium, cobalt, molybdenum, tungsten, and combinations thereof.

The characterization of the non-copper metal elements and the amount of each element may be determined by acid extraction of the at least one treated surface of the surface-treated copper foil, and then analysis of the extracted solution by an inductively coupled plasma instrument (ICP).

In some embodiments of the invention, the at least one treated surface of the surface-treated copper has a total amount of nickel, cobalt, and molybdenum ranging from about 10 $\mu g/dm^2$ to about 450 $\mu g/dm^2$; or about 20 $\mu g/dm^2$ to about 250 $\mu g/dm^2$; or about 50 $\mu g/dm^2$ to about 100 $\mu g/dm^2$.

In some embodiments of the invention, the total amount of nickel of the at least one treated surface of the surface-treated copper is from 0 $\mu g/dm^2$ to about 250 $\mu g/dm^2$; or about 10 $\mu g/dm^2$ to about 200 $\mu g/dm^2$; or about 20 $\mu g/dm^2$ to about 100 $\mu g/dm^2$.

In some embodiments of the invention, the total amount of cobalt of the at least one treated surface of the surface-treated copper is from 0 $\mu g/dm^2$ to about 300 $\mu g/dm^2$; or about 10 $\mu g/dm^2$ to about 250 $\mu g/dm^2$; or about 20 $\mu g/dm^2$ to about 100 $\mu g/dm^2$.

In some embodiments of the invention, the total amount of molybdenum of the at least one treated surface of the surface-treated copper is from 0 $\mu g/dm^2$ to about 200 $\mu g/dm^2$; or 0 $\mu g/dm^2$ to about 150 $\mu g/dm^2$; or about 5 $\mu g/dm^2$ to about 100 $\mu g/dm^2$.

When the present surface-treated copper foil is incorporated into a flexible copper-clad laminate, the adhesion between the copper foil and the dielectric layer consists of a mechanical adhesion from the roughness of the copper foil but also a chemical bond from the adhesion promoter if the adhesion-promotion layer is present. Generally, the last surface treatment is to form an adhesion-promotion layer by treating with a known adhesion promotor such as a silane-based coupling agent, and the like.

After the adhesion promotor treatment was finished, the moisture was removed by an electric heater to obtain the surface-treated copper foils of the invention.

The surface-treated copper foil of the invention has a thickness in the range of about 3 $\mu m$ to about 35 $\mu m$, or about 5 $\mu m$ to about 25 $\mu m$, or about 6 $\mu m$ to about 18 $\mu m$.

Surface-treated copper foils are commercially available from, for example, Chang Chun Petrochemical Co.; Nan Ya Plastics Co.; Mitsui Mining & Smelting Co.; Furukawa Electric Co.; Fukuda Metal Foil & Powder Co; Co-Tech Development Corp.; or LCY Group.

Dielectric Layer

The flexible copper-clad laminate (FCCL) of the invention comprises the surface-treated copper foil of the invention and a dielectric layer provided on the at least one treated surface of the surface-treated copper foil.

The dielectric layer either in single-sided or double-sided FCCL of the invention has a dielectric constant (Dk) of 3.4 or less, and a dielectric loss (Df) of 0.006 or less at the frequency of 10 GHz as measured according to the IPC-TM 650 No. 2.5.5.13 method. The dielectric layer of the present FCCL preferably has a Dk of 3.0 or less, or 2.5 or less, or 2.0 or less, or 1.0 or less, at the frequency of 10 GHz. The dielectric layer of the present FCCL preferably has a Df of 0.005 or less, or 0.004 or less, or 0.003 or less, or 0.002 or less, or 0.001 or less at the frequency of 10 GHz.

Except for the low dielectric properties, other essential criteria for high speed/high frequency flexible printed circuits (FPCs) is thermal stability. During the FPCs manufacturing, the process temperature may be as high as 260° C. to 350° C., the dielectric layer are thus required to sustain high temperature for several hours. The dielectric layer either in single-sided or double-sided FCCL of the invention is composed of a polymeric material of a polymeric material having a thermal decomposition temperature (1%) of 260° C. or higher, or 300° C. or higher, or 340° C. or higher.

One skilled artisan can selected the suitable polymeric material to form the dielectric layer either in single-sided or double-sided FCCL of the invention with the abovementioned characteristics for the desired applications. Suitable polymeric material includes polyimides (PI), liquid crystal polymers, or fluorine-based polymers such as poly(tetrafluoroethylene). Preferably, the dielectric layer is composed of polyimide.

Polyimide

When the dielectric layer is composed of polyimide, precursors of the polyimide is the corresponding polyamic acid that may be prepared by any process known to a person skilled in the art. The steps include adding a diamine component, a dianhydride component into a solvent, mixing and stirring at a suitable temperature to obtain a polyimide precursor, i.e. a polyamic acid. The polyimide precursor may be cast on a base film, baked and cured at an elevated temperature to provide a polyimide film. When the base film is the present surface-treated copper foil, then a single sided copper-clad laminate of the invention may be obtained.

Suitable diamine component may be an aromatic diamine selected from the group consisting of p-phenylenediamine (PPD), m-phenylenediamine (MPD), 2,5-dimethyl-1,4-phenylenediamine (DPX), 2,4-diaminotoluene, 2,5-diaminotoluene, 2,6-diaminotoluene, trifluoro-methyl-2,4-diaminobenzene, trifluoromethyl-3,5-diaminobenzene, 4,4'-diamino-biphenyl, 2,2'-dimethyl-4,4'-diaminobiphenyl, 3,3'-dimethyl-4,4'-diaminobiphenyl, 2,2'-bis (trifluoro-methyl) benzidine (TFMB), 2,2-bis-(4-aminophenyl)propane, 2,2'-bis(4-amino-phenyl) hexafluoropropane (6F diamine), 4,4'-diaminobenzophenone, 4,4'-diaminodiphenyl methane (MDA), 4,4'-diaminodiphenyl ether (ODA), 3,4'-diaminodiphenyl ether, 4,4'-diaminobenzanilide, 2-methoxy-4,4'-diaminobenzanilide, 1,2-bis-(4-aminophenoxy)benzene, 1,3-bis-(4-aminophenoxy) benzene, 1,4-bis-(4-aminophenoxy) benzene, 1,2-bis-(3-amino-phenoxy)b enzene, 1,3-bis-(3-aminophenoxy)b enzene, 1,4-bis-(3-aminophenoxy) benzene, 1-(4-aminophenoxy)-3-(3-aminophenoxy)b enzene, 1-(4-aminophenoxy)-4-(3-aminophen-oxy)benzene, 4,4'-bis(aminophenoxy)biphenyl (BAPB), 2,2-bis-(4-[4-aminophenoxy] phenyl)propane (BAPP), 4-amino-phenyl-3-aminobenzoate, 4-aminophenyl-4-amino-benzoate, and N,N-bis-(4-aminophenyl) aniline, and combinations thereof.

Suitable dianhydride component may be an aromatic dianhydride selected from the group consisting of pyromellitic dianhydride (PMDA), 3,3',4,4'-biphenyl tetracarboxylic dianhydride (BPDA), 2,2',3,3'-biphenyl tetracarboxylic dianhydride, 2,3,3',4'-biphenyl tetracarboxylic dianhydride, 2,2'-bis[4-(4-aminophenoxy)phenyl]tetracarboxylic dianhydride, 3,3',4,4'-benzophenone tetracarboxylic dianhydride (BTDA), 2,2',3,3'-benzophenone tetracarboxylic dianhydride, 2,3,3',4'-benzophenone tetracarboxylic dianhydride, bis-2,5-(3',4'-dicarboxydiphenylether), 4,4'-oxydiphthalic anhydride (ODPA), bis(3,4-dicarboxy-phenyl) thioether dianhydride, bisphenol A dianhydride (BPADA), bisphenol S dianhydride, 2,2-bis-(3,4-dicarb oxyphenyl) 1, 1,1,3,3,3,-hexafluoropropane dianhydride (6FDA), and combinations thereof. Noted that the dianhydride(s) constituting the dianhydride component may in form of a dianhydride, or in forms of a tetra-acid or a diester acid halides. However, in some embodiments, the dianhydride component in form of dianhydride is preferred, because it is generally more reactive than the corresponding acid or ester.

Examples of the solvent used in the polymerization of polyamic acid include dimethylacetamide, N-methyl pyrrolidone, 2-butanone, diglyme, and xylene, and one kind or two or more kinds may be used in combination.

Commercially available low dielectric polyimide films include Kapton® from DuPont Electronics, Inc.; APICAL™, Pixeo™ BP from Kaneka; and UPILEX® from Ube.

In some embodiments of the invention, the dielectric layer either in single-sided or double-sided FCCL of the invention has a thickness of about 5 μm to about 100 μm, or about 10 μm to about 75 μm, or about 25 μm to about 50 μm. Depending on the specific applications of the present FCCLs, the ratio of the thickness of the surface-treated copper foil to the thickness of dielectric layer ranges from about 2:1 to about 1:10.

Copper-Clad Laminate

Figure 4:
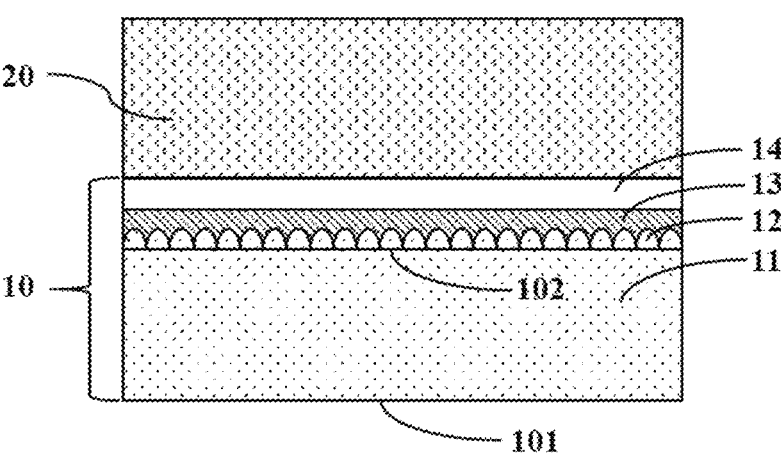
FIG. 4 shows a schematic sideview of one embodiment of the present flexible copper-clad laminate 100.

The present FCCL may be a single-sided FCCL or a double-sided FCCL. The single-sided FCCL 100 of the invention comprises a copper foil 10 and a dielectric layer 20 as shown in FIG. 4 that may also be referred as an 2-layered FCCL or a non-adhesive FCCL. The surface-treated copper foil 10 has an untreated surface 101 and a treated surface 102 and a cross sectional grain structure 11. The treated surface 102 is in contact with the dielectric layer 20. The treated surface 102 consists of a nodulation layer 12, a passivation layer 13 and an adhesion-promotion layer 14.

Noted that a single-sided 3-layered FCCL generally has a structure in sequence of a copper foil, an adhesive layer, and a dielectric layer. In order to minimize the thickness of a single-sided FCCL and save production cost, a 2-layered FCCL is generally preferred over a 3-layered FCCL.

In some embodiments of the invention, the FCCL is a single-sided copper-clad laminate consisting of a surface-treated copper foil of the invention and a dielectric layer, wherein the dielectric layer is provided on the at least one treated surface of the surface-treated copper foil.

Figure 5:
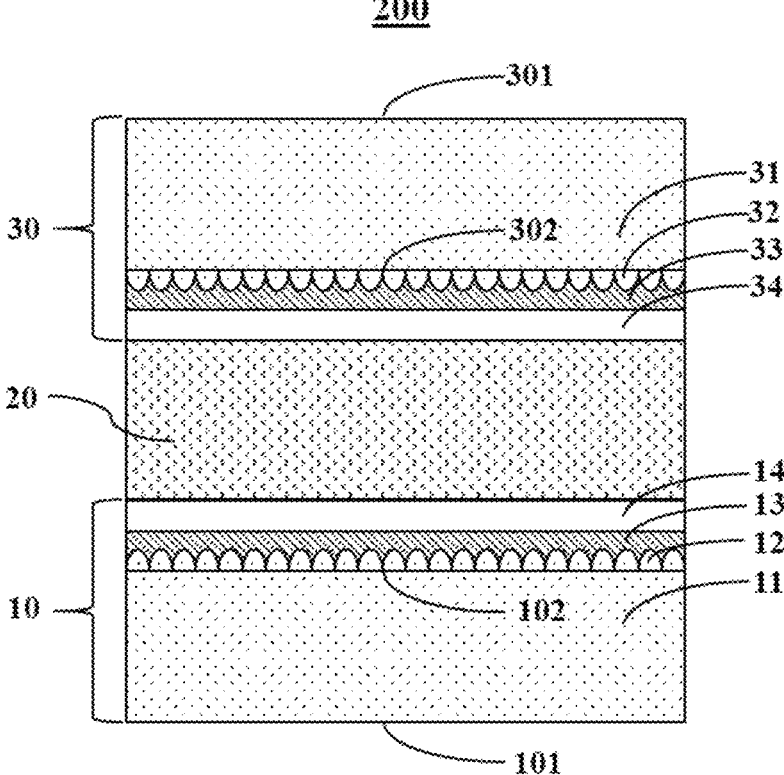
FIG. 5 shows an expanded sideview of one embodiment of the present flexible copper-clad laminate 200.

Moreover, FIG. 5 shows a schematic sideview of an FCCL 200 of the invention, which is a double-sided FCCL having a layer construction in sequence of: a first surface-treated copper foil 10, a dielectric layer 20, and a second surface-treated copper foil 30, wherein the copper foil 30 and copper foil 10 may be the same or different. As described previously, the surface-treated copper foil 10 has an untreated surface 101 and a treated surface 102 and a cross sectional grain structure 11. The treated surface 102 is in contact with the dielectric layer 20. The treated surface 102 is composed of a nodulation layer 12, a passivation layer 13 and an adhesion-promotion layer 14. Similarly, the surface-treated copper foil 30 has an untreated surface 301 and a treated surface 302 and a cross sectional grain structure 31. The treated surface 302 is in contact with the dielectric layer 20. The treated surface 302 is composed of a nodulation layer 32, a passivation layer 33 and an adhesion-promotion layer 34.

In some embodiments of the invention, the FCCL is a double-sided copper-clad laminate consisting of a first surface-treated copper foil of the invention, a second surface-treated copper foil of the invention, and a dielectric layer inserted between the first and second surface-treated copper foils; wherein both sides of the dielectric layer are in contact with the treated surface of the first copper foil and the treated surface of the second copper foil, respectively. The first surface-treated copper foil of the invention and the second surface-treated copper foil of the invention may be the same or different.

The present FCCLs may be manufactured by laminating a thermoplastic film composed of the above mentioned polymeric material onto the at least one treated surface of the surface-treated copper foil. Alternatively, the present FCCL may be manufactured by applying a coating composition containing the above mentioned polymeric material or precursors thereof to the treated surface of the present surface-treated copper foil. Depending on the choice of the polymeric material forming the dielectric layer, the polymeric composition may contain suitable solvent or solvent system. Any appropriate preparation methods that would be readily determined by one skilled in the art may be utilized to form the dielectric layer.

The polymeric composition forming the dielectric layer may be applied by various coating methods that are well known in the art, including spray coating, curtain coating, knife over roll coating, air knife coating, slot die coating, direct gravure, reverse gravure, offset gravure, or roll coating.

The dielectric layer of the present FCCL is preferably prepared by coating a polymeric material containing solution/dispersion directly due to the ease of controlling the thickness and physical properties. The dielectric layer may be formed of only a single layer, but is preferably formed of a plurality of layers in consideration of adhesion between the dielectric layer and the present surface-treated copper foil.

As described above, the dielectric layer may be formed either in a single layer or a plurality of layers. For a single-sided FCCL having a single polyimide layer, the polyimide precursor may be directly casting onto the surface-treated copper foil; for a plurality of polyimide layers, it can be formed by sequentially applying other polyamic acid solutions on a polyamic acid solution formed of different constituent components. When the dielectric layer composed of polyimide is formed of a plurality of layers, a polyimide precursor of the same composition may be used twice or more.

For a double-sided FCCL having a plurality of polyimide layers as the dielectric layer, then the polyimide layer is preferably formed to have a multilayer structure, then laminate with the first and the second surface-treated copper foils either simultaneously or sequentially.

Noted that the resist side of the present surface-treated copper foil may be covered with a releasable protective layer when dip coating or immersion coating is employed. In some embodiments, slot die coating may be used. As used herein, the term "coating" is not intended to limit the method by which it is applied onto the treated surface of the surface-treated copper foil.

After coating, the solvent or mixed solvents may be removed by heating in an oven at a temperature in the range of 100-200° C. The temperature and length of time in the oven will depend on the solvent used and thickness of the coating.

Process parameters such as temperatures, pressures, and times for preparing the present copper-clad laminates are generally dependent on the material properties of the substrate as well as the preparation method. One skilled in the art can decide suitable process parameters accordingly.

In some embodiments, the present flexible copper-clad laminate is prepared by hot pressing.

In some embodiments, the hot pressing is performed at a temperature ranging from about 200° C. to about 400° C., or from about 300° C. to about 370° C.; at a pressure ranging from about 0.2 MPa to about 10.0 MPa, or from about 0.5 MPa to about 5 MPa; and for a duration from about 30 minutes to about 300 minutes, or from about 60 minute to about 240 minutes.

In the invention, physical properties of softness and machinability may be significantly enhanced by controlling the adhesion strength between the surface-treated copper foil and the dielectric layer to specific ranges. The present FCCLs either in single-sided or double-sided FCCL has a peel strength of 0.9 kN/m or more with a 90 degree peeling test. Preferably, the present FCCLs has a peel strength within a range of 0.9 to 2.0 kN/m, and more preferably from 1.0 kN/m to 1.5 kN/m. When the peel strength between the dielectric layer and the surface-treated copper foil is less than 0.8 kN/m, there may be a delamination issue during the FPC manufacturing process.

In the invention, a method of measuring the adhesion strength is not particularly limited, however, the adhesive strength may be measured in accordance with IPC-TM-650 using a peel strength tensile tester INSTRON™ 5543.

In addition, the present flexible copper-clad laminates also have excellent heat resistance, and are expected to withstand the soldering and re-flow steps during the printed circuits fabrication processes. For example, the present FCCL can withstand a thermal treatment for at least 30 seconds or longer without blistering formation or delamination at 260° C., or 288° C., or even 320° C. or higher.

Flexible Printed Circuit (FPC)

The flexible copper-clad laminates of the invention may be subjected to known patterning methods such as a subtractive method (photolithography) or an additive method (electroplating) to form a predetermined conductor pattern (i.e. circuit) on the resist side of the copper foil to produce a flexible printed circuit (FPC). Because the manufacturing processes for FPCs are well known to one skilled in the art, the disclosure of which is omitted herein for the interest of brevity.

The flexible printed circuits produced from the present FCCLs may then be assembled with other components such as leads and holes to form various electrical articles utilizing high speed signals with a data rate of at least 1 Gbps, and/or high frequency signals of at least 1 GHz.

The flexible printed circuit board comprising the FCCL of the invention, at a frequency of 10 GHz, exhibits an insertion loss of 3.28 dB/10 cm or less, or 3.20 dB/10 cm or less, or 3.10 dB/10 cm or less, or 3.00 dB/10 cm or less. Furthermore, the flexible printed circuit board comprising the FCCL of the invention, at a frequency of 28 GHz, exhibits an insertion loss of 6.02 dB/10 cm or less, or 6.00 dB/10 cm or less, or 5.90 dB/10 cm or less.

Products utilizing the high performance FPCs include servers, routers, storage area networks, power amplifiers, transceiver modules, high speed data channels, and so on.

Up to now, flexible printed circuit boards are widely applied in computer peripherals and home appliances such as ribbon lead of hardware drives, automotive electronics, cameras, digital video cameras, instruments, office automation devices, health care equipment etc. Recent years FPCs have their applications in Chip on Flex (COF) film working for Liquid Crystal Display (LCD) modules. With the gradual widening of application field of FPCs, great changes have taken place to their structural form, product functions and performance.

In addition, consumer devices demanding higher data rate and computing performance include mobile electronic devices such as laptop computers, tablet computers, e-readers, portable game devices, portable media players, digital cameras, cellular telephones, or wearable devices; smart home devices; manned and unmanned vehicles; aviation devices such as drones, airplanes, and space equipment; and so on.

Without further elaboration, it is believed that one skilled in the art using the preceding description can utilize the invention to its fullest extent. The following examples are, therefore, to be construed as merely illustrative, and not limiting of the disclosure in any way whatsoever.

EXAMPLES

The abbreviation "E" stands for "Example" and "CE" stands for "Comparative Example" is followed by a number indicating in which example the copper-clad laminate is prepared. The examples and comparative examples were all prepared and tested in a similar manner.

Materials

The polyimide film was obtained from DuPont, under the trade name Kapton®; the PI film has a Dk of 3.2, a Df of 0.003 at 10 GHz, and a film thickness of about 50 μm.

Copper foils used in the examples and comparative examples were purchased from commercial vendors including Chang Chun Petrochemical Co., Fukuda Metal Foil & Powder Co., Furukawa Electric Co., JX Nippon Co., Mitsui Mining & Smelting Co. and Nan Ya Plasties Co. The characterized properties of each copper foil were listed in Table 1.

Preparation of Example 1

Two pieces of copper foil-CF1 (54 cm×54 cm) were cut from the bulk copper foil roll having a width of 54 cm. The polyimide film was also cut into a square piece (50 cm×50 cm). The polyimide film was placed between two pieces of copper foil-CF1 so that both sides of the polyimide film were in contact with the treated surface of each copper foil respectively as shown in FIG. 5. The resulted stacked body was laminated by hot pressing under the conditions of a temperature up to 370° C., a duration of 60 minutes, and a pressure of 2.4 MPa (350 psi) to obtain a flexible copper-clad laminate for evaluation. The prepared FCCL had a construction of Cu foil (12 μm)/PI film (50 μm)/Cu foil (12 μm). The procedure were repeated to provide sufficient test specimens for peel strength and insertions loss evaluations.

Preparation of Examples 2-7 and Comparative Example 1-6

Flexible copper-clad laminates of the examples (E2-E7) and comparative examples (CE1-CE6) were prepared in the same manner as previously described for Example 1 expect using different copper foil as listed in Table 1.

Each FCCL example was cut into the test specimens and measured according to the methods described below. Testing results of the FCCLs of Examples 1-7 and Comparative Examples 1-6 were also listed in Table 1.

Testing Methods

Surface Roughness (Sz): A copper foil specimen was examined at five areas using a laser scanning microscope (manufacturing by Olympus, model: OLS-5000) with a 100 times magnification of objective lens and without any cutoff filters. The area roughness were measured at each spot/point according to ISO25178 method, and the measured data were averaged. Sz is defined as the sum of 10 largest peak height values and 10 largest pit depth values within a defined area.

Nodule density: A copper foil specimen was examined by using an scanning electron microscope (SEM). A micrograph was taken at an area of 5μm×5μm with a 5000 times magnification. The number of nodules were counted and recorded in Table 1.

Non-copper metal elements: A test specimen was punched off the copper foil to provide a square specimen with a size of 10 cm×10 cm, and then the treated surface of the test specimen was washed by an Aqua Regia™ solution to collect a solution containing the non-copper metal elements stripped from the test specimen. The characterization of the non-copper metal elements and the amount of each element were analyzed and determined by an ICP-OES instrument, manufactured by Agilent Technologies, model no. 5110 ICP-OES.

Grain size: The copper foil specimens were oven baked at 200° C. for 2 hours before the grain size analysis. Each test specimen of a copper foil with a size of about 1 cm² was cut by ion beam milling method. The contaminants formed during cutting process were removed to reveal the clean cross-sectional surface of the copper foil. The test specimen was analyzed by electron backscatter diffraction (EBSD) using an Oxford Symmetry detector, and the cross-sectional grain size was calculated by the AZtecCrystal and Channel 5 software. To eliminate the calculation noise, copper crystals having a grain size of less than 0.5 μm in equal circle diameter (ECD) and twin boundary (axis: 111 degree: 60°) were excluded.

Electrical conductivity: The copper foil specimens were baked under temperature of 200° C. for a duration of 2 hours before the conductivity testing. A test specimen was prepared by provided a square copper foil with a punched size of 10 cm×10 cm. Volume resistance, surface resistance, and conductivity were measured by using a HIOKI RM3545 4-point probe and calculated according to the standard method of JIS K 7194.

Peel strength: A rectangular test specimen of 75 mm×30 mm was cut from the FCCL prepared in each example or comparative example. Then, the test specimen was patterned with straight lines where the line/space was 1 mm/1 mm. The patterned specimen was fixed on a drum wheel. Then, the beginning of one testing line was separated from patterned specimen and was clamped tightly by the upper clamp. By using a material test machine (manufactured by SHIMADZU company, model: AG-IS), the peel strength was tested by maintaining a constant 90 degree angle whilst the two glued components were peeled apart with a pulling speed of 50.8 mm/minute. The 90 degree peel strength was measured and recorded in unit of kN/m. The peel strength data were averaged, and listed in Table 1.

Insertion loss test: Each flexible copper-clad laminate prepared in the examples and comparative examples was further processed to form a Micro-Strip structure (30 cm×25 cm). The insertion loss of each test specimen was measured by a KEYSIGHT Network Analyzer, by scanning from 10 MHz to 40 GHz with an impedance of 50Ω, at a 23° C., sweep number: 4001 points, and calibration: Keysight AFR. The insertion loss (dB/10 cm) at 10 GHz and 28 GHz of the tested examples were reported in Table 1.

TABLE 1

| Sample ID | Copper foil | Type | Conductivity ×10⁶ S/m | grain size μm | Sz μm | Nodule density per 25 μm² | [Ni] | [Co] | [Mo] | [Ni + Co + Mo] | Adhesion-promotion layer Y/N | Peel Strength (kN/m) kN/m | Insertion Loss @ 10 GHz | Insertion Loss @ 28 GHz |
|---|---|---|---|---|---|---|---|---|---|---|---|---|---|---|
| | | | | | | | | | □g/dm² | | | | dB/10 cm | |
| Ex. 1 | CF1 | RA | 57.43 | 2.4 | 2.39 | 0 | 0 | 251 | 154 | 405 | Yes | 1.080 | −3.26 | −6.05 |
| Ex. 2 | CF2 | ED | 57.59 | 1.4 | 2.81 | 51 | 91 | 0 | 0 | 91 | Yes | 1.340 | −3.27 | −6.03 |
| Ex. 3 | CF3 | ED | 57.73 | 1.6 | 1.92 | 40 | 197 | 0 | 0 | 197 | Yes | 0.960 | −3.23 | −6.02 |
| Ex. 4 | CF4 | ED | 57.62 | 1.0 | 1.14 | 0 | 0 | 200 | 125 | 325 | Yes | 1.360 | −3.23 | −6.02 |
| Ex. 5 | CF5 | ED | 57.44 | 1.8 | 1.94 | 0 | 20 | 0 | 0 | 20 | Yes | 0.990 | −2.98 | −5.79 |
| Ex. 6 | CF6 | ED | 57.56 | 1.1 | 2.12 | 156 | 39 | 24 | 8 | 71 | Yes | 1.200 | −3.14 | −5.90 |
| Ex. 7 | CF7 | ED | 58.00 | 1.9 | 2.17 | 127 | 36 | 20 | 16 | 72 | Yes | 1.160 | −3.16 | −5.95 |
| CE 1 | CF8 | RA | 58.51 | 2.7 | 1.56 | 0 | 0 | 0 | 0 | 0 | NO | 0.510 | — | — |
| CE 2 | CF9 | ED | 56.75 | 1.5 | 2.41 | 0 | 0 | 0 | 0 | 0 | Yes | 0.790 | −3.42 | −6.53 |
| CE 3 | CF10 | ED | 56.79 | 1.1 | 3.03 | 46 | 64 | 0 | 0 | 64 | Yes | 0.810 | −3.48 | −6.88 |
| CE 4 | CF11 | RA | 54.82 | 0.9 | 2.21 | 61 | 53 | 0 | 0 | 53 | Yes | 1.030 | −3.29 | −6.30 |
| CE 5 | CF12 | RA | 58.51 | 2.7 | 2.17 | 314 | 316 | 579 | 0 | 895 | Yes | 1.150 | −3.56 | −7.01 |
| CE 6 | CF13 | RA | 58.23 | 2.7 | 3.22 | 57 | 67 | 0 | 0 | 67 | Yes | 1.240 | −3.31 | −6.17 |

From the results of Table 1, the followings are evident.

Each FCCL prepared in Examples 1 to 7 showed good peel strength (i.e., more than 0.9 kN/m) and exhibited desirable low insertion loss at 10 GHz (i.e., less than 3.28 dB/10 cm) and at 28 GHz (i.e., less than 6.10 dB/10 cm).

The FCCL of CE1 was composed of a RA copper foil-CF8 having no nodulation layer similar to the RA copper foil-CF1 used in the laminate of E1. However, CF8 also had neither a passivation layer or an adhesion-promotion layer, the FCCL made therefrom showed poor peel strength. As a result, the FCCL of CE1 was unable to be processed further to obtain an FPC having a Micro-Strip structure for insertion loss testing.

Although the FCCL of CE2 was composed of a copper foil-CF9 having neither a nodulation layer nor a passivation layer, it showed a peel strength slightly better than that of CE1. One may attribute the better peel strength to the higher surface roughness of copper foil-CF9 than that of the copper foil-CF8 (2.41 μm versus 1.56 μm), and/or the presence of an adhesion-promotion layer in copper foil-CF9.

In CE2, CE3 and CE4, the FPCs made from the respective copper-clad laminates showed poor insertion loss at 10 GHz and 28 GHz that may be due to the copper foil used therein had an electrical conductivity of less than $57.0 \times 10^6$ S/m.

The FPC made from the FCCL of CE5 showed poor insertion loss that may be resulted from the copper foil-CF12 having higher grain size, nodule density, and/or total amount of Ni, Co and Mo.

The FPC made from the FCCL of CE6 showed poor insertion loss that may be due to high grain size and/or high surface roughness of the copper foil-CF13.

While the invention has been illustrated and described in typical embodiments, it is not intended to be limited to the details shown, since various modifications and substitutions are possible without departing from the spirit of the invention. As such, modifications and equivalents of the invention herein disclosed may occur to persons skilled in the art using no more than routine experimentation, and all such modifications and equivalents are believed to be within the spirit and scope of the invention as defined by the following claims.

What is claimed is:

1. A flexible copper-clad laminate, comprising:

a surface-treated copper foil, characterized in that the surface-treated copper foil has an electric conductivity of $57.0 \times 10^6$ S/m or more, a cross-sectional average grain size of about 1 μm to about 2.5 μm, a thickness of about 3 μm to about 35 μm; and the surface-treated copper foil has a treated surface that has a surface roughness (Sz) of 3.0 μm or less, wherein the surface roughness (Sz) is measured at an outermost surface of the surface-treated copper foil according to ISO 25178; and a dielectric layer provided on the treated surface of the surface-treated copper foil, wherein:

the dielectric layer has a thickness of about 5 μm to about 100 μm;

the dielectric layer is composed of a layer of a polymeric material having a thermal decomposition temperature (1%) of 260° C. or higher; and the flexible copper-clad laminate has a peel strength of about 0.9 kN/m or more as measured according to IPC-TM 650.

2. The flexible copper-clad laminate of claim 1, wherein the dielectric layer has a Dk of 3.4 or less and a Df of 0.006 or less at a frequency of 10 GHz as measured according to IPC-TM 650 No. 2.5.5.13.

3. The flexible copper-clad laminate of claim 1, wherein the dielectric layer is composed of polyimide.

4. A printed circuit board, that is manufactured from the flexible copper-clad laminate of claim 1, wherein the printed circuit board is a flexible printed circuit board, a flexible-rigid printed circuit board or a rigid printed circuit board.

5. The printed circuit board of claim 4, which is a flexible printed circuit board that exhibits an insertion loss of 3.28 dB/10 cm or less at a frequency of 10 GHZ, or that exhibits an insertion loss of 6.10 dB/10 cm or less at a frequency of 28 GHz.

6. An electronic device, comprising the printed circuit board of claim 4.

* * * * *